(12) United States Patent
Carr

(10) Patent No.: US 6,357,108 B1
(45) Date of Patent: Mar. 19, 2002

(54) DEPANELING SYSTEM HAVING MULTIPLE ROUTER STATIONS

(75) Inventor: Douglas Patrick Carr, Boulder, CO (US)

(73) Assignee: PMJ Cencorp, LLC, Longmont, CO (US)

( * ) Notice: Subject to any disclaimer, the term of this patent is extended or adjusted under 35 U.S.C. 154(b) by 0 days.

(21) Appl. No.: 09/197,382

(22) Filed: Nov. 20, 1998

(51) Int. Cl.[7] .............................. B23Q 15/00; B26D 3/00
(52) U.S. Cl. .............................. 29/711; 29/714; 29/720; 29/426.3; 29/426.4; 29/33 P; 83/916; 83/929.1
(58) Field of Search .......................... 29/709, 711, 714, 29/720, 426.3, 436.4, 33 P; 83/553, 916, 929.1, 953; 409/162, 158

(56) References Cited

U.S. PATENT DOCUMENTS

| | | | |
|---|---|---|---|
| 3,854,889 A | * 12/1974 | Lemelson | |
| 4,449,277 A | * 5/1984 | Hasegawa et al. | 29/33 P |
| 4,621,552 A | * 11/1986 | Lopez | 83/929.1 |
| 4,683,789 A | 8/1987 | Lopez | |
| 4,708,232 A | * 11/1987 | Hata et al. | 29/33 P |
| 4,970,765 A | * 11/1990 | Sakawa et al. | 29/33 P |
| 4,984,351 A | * 1/1991 | Matsuyama et al. | 29/33 P |
| 5,067,229 A | 11/1991 | Nakamura | |
| 5,084,952 A | * 2/1992 | Grabow | |
| 5,210,922 A | * 5/1993 | Carr | 29/426.3 |
| 5,370,212 A | * 12/1994 | Mizuntani et al. | 198/346.1 |
| 5,429,461 A | 7/1995 | Mukherjee et al. | |
| 5,438,740 A | 8/1995 | Carr et al. | |
| 5,826,692 A | * 10/1998 | Blanc | 198/346.1 |
| 5,894,648 A | * 4/1999 | Hill et al. | |

FOREIGN PATENT DOCUMENTS

| | | | |
|---|---|---|---|
| JP | 59097917 | 6/1984 | |
| JP | 04112595 | 4/1992 | |
| JP | 05-285799 | * 4/1992 | |
| JP | 5-169328 | * 7/1993 | 29/711 |
| JP | 05285799 | 11/1993 | |
| WO | WO97/31515 | 8/1997 | |

OTHER PUBLICATIONS

Author Name Unavailable, ""Depaneling Methods Change With the Industry"," Electronic Packaging & Production, Cahners Publishing Co. (Newton, Massachusetts), vol. 31 (No. 2), pp. 54–58, (Feb. 1, 1991).

* cited by examiner

Primary Examiner—S. Thomas Hughes
Assistant Examiner—Eric Compton
(74) Attorney, Agent, or Firm—Chrisman, Bynum & Johnson, P.C.

(57) ABSTRACT

A depaneling system having multiple router stations. A feeder station in the dual routing station receives a panel from a feeder station. The feeder station then selectively delivers the panel to one of the router stations. The router station then severs all of the connections between the panel and the PC boards. The multiple router stations can also share a common router that is used by each station to sever the connections. In order to use a common router the router station have a movable receiving base which moves along a first axis. The router then moves along the second axis. The router and receiving base are then moved along the first and second axises independently to sever the connections.

26 Claims, 7 Drawing Sheets

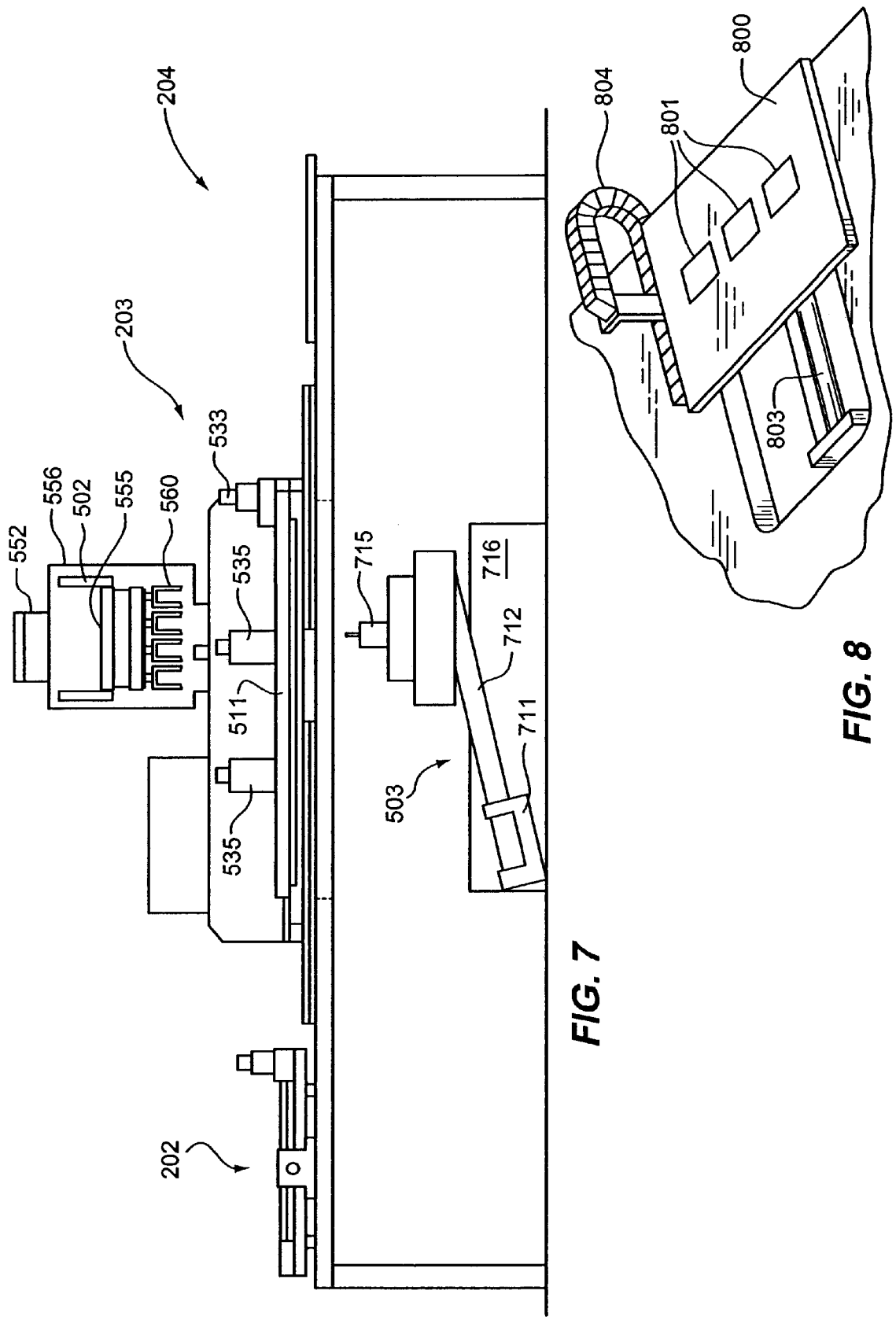

DEPANELING SYSTEM HAVING MULTIPLE ROUTER STATIONS

FIELD OF THE INVENTION

The present invention relates to removing PC boards from a panel containing the PC boards. More particularly, the present invention relates to providing multiple router stations to depanel PC Boards with a common feeding station that selectively delivers PC boards to router stations that depanel the boards. The present invention also relates to providing multiple router stations that share a common router.

PROBLEM

In today's society, most electronic devices, such as televisions and telephones, have at least one printed circuit board ("PC board") in their circuitry. As the use of PC boards in electronic devices has increased, it has become necessary to be able to mass produce PC boards in order to mass produce electronic equipment. A common method in the mass production of PC boards is to assemble multiple PC boards at one time in a single panel. By using a single panel, assembly equipment only has to manipulate a single panel to operate on multiple PC boards. This simplifies the production of the PC boards and reduces the amount of of equipment needed to produce the PC boards. Furthermore, the time needed to produce each PC board is reduced.

Mass production of the PC boards in a single panel requires that each individual PC board must be removed or depaneled from the panel before the individual PC boards can be integrated into electronic equipment. The time needed to depanel individual PC boards from a panel is a critical factor in the production time of PC boards. In order to decrease the time needed to produce a PC board as well as electronic equipment, it is necessary to reduce the time needed to depanel individual PC boards from a panel.

In order to depanel PC boards from a panel, all connections between each individual PC board and the panel must be severed. Automated depaneling systems are commonly used to sever all connections between the individual PC boards and a panel. The individual PC boards are then moved by the automated depaneling system to a subsequent processing system or to a registration element which provides the individual PC boards to the subsequent processing system. It is a problem to reduce the cycle time needed to depanel all of the individual circuit boards from a panel.

The depaneling of individual PC boards from a panel typically involves three separate processes in a depaneling system. The three processes are delivery of a panel, depaneling individual PC boards from the panel, and providing the individual PC boards to a subsequent processing system. In a typical depaneling system, the three processes occur sequentially. First, the panel is delivered to the depaneling system. Second, the individual PC boards are depaneled. Finally, the individual PC boards are provided to a subsequent processing system.

These three operations must be done sequentially because of the physical constraints of the depaneling system. A depaneling system typically includes a table, a router and a robotic arm. A panel is received by the system and placed on the table in a preprogramed or registered position. A robotic hand at an end of the robotic arm grips each individual PC board in the panel. The router or some other cutting equipment then severs all of the connections between each PC board and the panel. After all of the connections are severed, the robotic arm moves the individual PC boards to a registration nest or a subsequent processing system. The depaneling system is not ready to receive a subsequent panel until the robotic arm returns and is able to hold the PC boards of the new panel. Therefore, a system is needed that reduces the time wasted waiting for the robotic arm to reset.

For the above reasons, there is a long felt need in the art for a depaneling system having improved cycle time to increase the number of circuit boards per unit of time produced.

SOLUTION

The above and other problems are solved and an advance in the arts is made by the provision of a depaneling system having multiple router stations. One advantage of multiple router stations in a depaneling system is that throughput of panels through the system is increased. A second advantage is that different types of PC boards can be depaneled by the same depaneling system without stopping the process and configuring the system to handle a different type of PC board when the type of PC board is changed. A third advantage is that the depaneling process does not have to stop when one of the router stations is not operational.

A depaneling system having multiple router stations in accordance with the present invention is configured in the following manner. A feeder station receives a panel from a preceding processing system. The feeder station then determines which router station will receive the panel. The determination may be made using one of the following methods. A first method for determining which router station receives the panel is based upon the type of panel received. In which case, each router station is configured to depanel a different type of PC board and the feeder station determines the type of panel received and delivers the received panel to the router station that is configured to handle that type of panel. A second method from determining the receiving router station is by making a determination of which router station is available to receive a panel and delivering the panel to the next available router station.

After the receiving router station is selected, the feeder station delivers the panel to the selected router station. In a preferred embodiment, the router stations are configured in the following manner to receive a panel. Each router station has a receiving base. The receiving base has two support rails to receive a panel. The support rails hold the panel in place in a known position. After the panel is in the receiving base, a robotic hand is lowered and fingers that extend from the hand are used to grasp each PC board in the panel. A router then severs all of the connections in the panel.

In a preferred embodiment, a common router is shared by the router stations. The common router reduces the number of active components in the depaneling system which minimizes the number of components that can break and reduces the expense of the system. In order for a common router to be used, the receiving base moves along a first axis and the router only moves along a second axis intersecting each of the multiple router stations. The panels are depaneled by moving the router into a cutting position and activating the router. The receiving base is then moved along the first axis and the router is moved along the second axis in order to sever all the connections between the PC boards and the panel.

After the PC boards are depaneled, the remainder of the panel is discarded through an opening in the system. At the same time, the PC boards are moved to a registration station by the robotic arm holding the PC boards. In the preferred embodiment, each router station has a corresponding registration station. The registration station receives the PC board while in a receiving position proximate the receiving station. The PC boards are placed in receiving slots of the registration station that are recessed areas configured to receive the PC boards in a known orientation by the robotic arm. The registration station is then moved to a delivery position. In the delivery position, a subsequent processing station can retrieve the PC boards from the receiving slots.

These and other advantages of the present invention will be apparent to those skilled in the art upon a reading of the detailed description below in combination with the accompanying drawings.

DESCRIPTION OF THE DRAWINGS

FIG. 7 illustrates a movable registration nest of a multiple router station depaneling system; and FIG. 8 illustrates a router in a multiple router station depaneling system.

DETAILED DESCRIPTION

Figure 1:
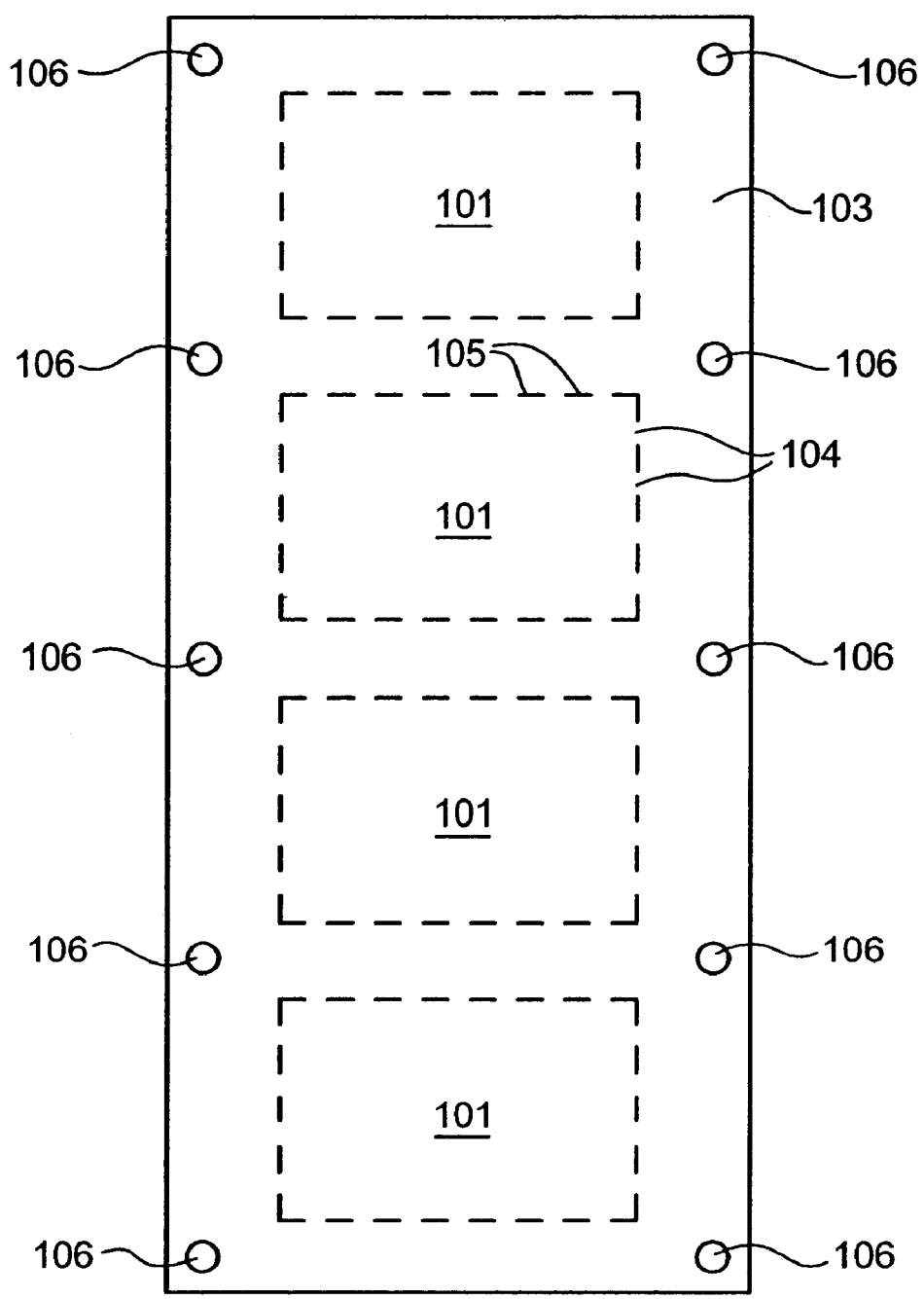
FIG. 1 illustrates a panel of PC boards.

Panel of PC Boards—FIG. 1

FIG. 1 illustrates panel 100 containing four PC boards 101. Slots 105 and tabs 104 define the edges of PC boards 101. Tabs 104 connect PC boards 101 to panel 100 and are cut during the depaneling process to liberate PC boards 101 from panel 100. Registration holes 106 in each panel 101 are used to determine the position and orientation of panel 100 in depaneling system 200 described below and illustrated in FIG. 2. Frame 103 is the material of panel 100 that holds PC boards 101 together as one panel 100. After tabs 104 are cut the material of frame 103 becomes debris. Although panel 100 is described with four panels 101, it is understood that panel 100 can have any number of PC boards that are arranged on panel 100 in any configuration. Furthermore, panel 100 and PC boards 101 have any shape and are not constrained to the rectangular shapes shown. The actual number and configuration of PC boards 101 on panel 100 is a design choice left to the maker of the panel.

Figure 2:
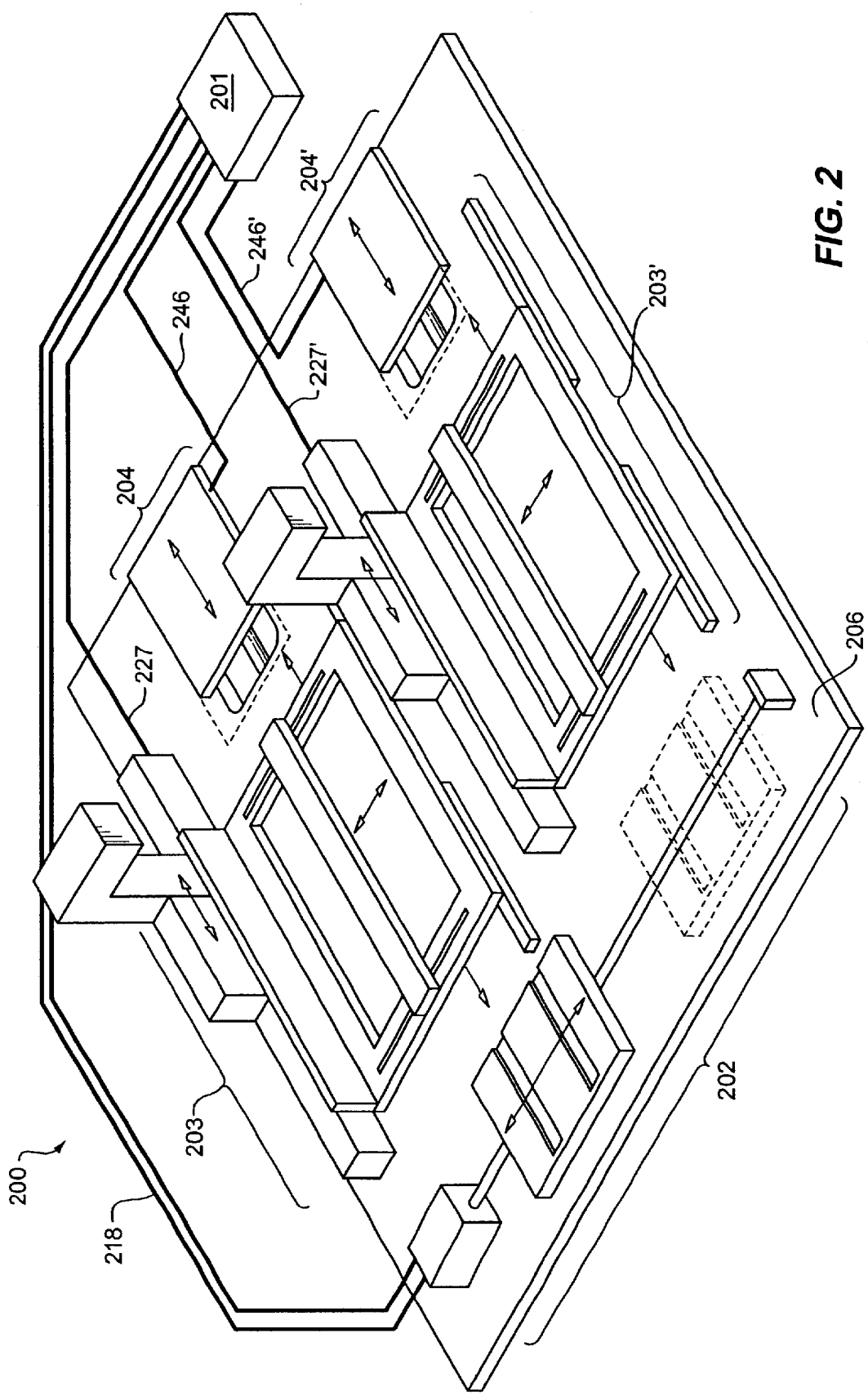
FIG. 2 illustrates a preferred exemplary embodiment of a depaneling system having multiple router stations.

A Preferred Exemplary Embodiment of a Depaneling System in Accordance with the Present Invention—FIG. 2

Depaneling system 200 is shown in FIG. 2. Depaneling system 200 has a feeder station 202, router stations 203–203', and registration stations 204–204' for removing PC boards 101 from panel 100. Those skilled in the art will appreciate that the concept of this invention may also be used in a tab reduction system in which not all of tabs 204 in panel 100 are severed and the PC boards 101 removed in a subsequent processing system. Furthermore, the present invention could be used in any system in which a router is to sever any number of connections between a PC board and a panel. Although, registration stations 204–204' may be replaced by conveyor belts to move the panel 100 to a subsequent processing system.

FIG. 2 illustrates an assembled view of all of the stations of multiple router station depaneling system 200 on a table 206. FIGS. 3–8 illustrate isolated view of the stations of depaneling system 200 in accordance with the present invention. In general, depaneling system 200 operates in the following manner. A panel 100 is received by a feeder station 202 and delivered to a router station 203 or 203' by a process described below. A router station 203 or 203' severs all of the connections between panel 100 and PC boards 101 in a manner described below. After all of the connections have been severed by router station 203 or 203', a registration station 204 or 204' receives the boards from router station 203 or 203'. Registration station 204 or 204' delivers PC boards 101 to a subsequent processing system (not shown). Registration station 204 and 204' are described in detail below.

All of the processes performed by the stations of depaneling system 200 are controlled by controller 201. Controller 201 is a personal computer or any other type of processor capable of executing a series of instructions for operating each subsystem that are stored in a memory of controller 201. Signals are transmitted between feeder station 202 and controller 201 via path 218, between router station 203–203' and controller 201 via path 227 and 227', and between registration station 204–204' and controller 201 via path 246 and 246'. Although only two router stations 203 and 203' are shown for exemplary purposes, it should be apparent to those skilled in the art that any number of router stations can be added operate in parallel with router stations 203 and 203'. Furthermore, those skilled in the art will appreciated that although router stations 203 and 203' are shown both being substantially parallel to an X axis, the position of router stations 203 and 203' with respect to one another is unimportant in the present invention.

Figure 3:
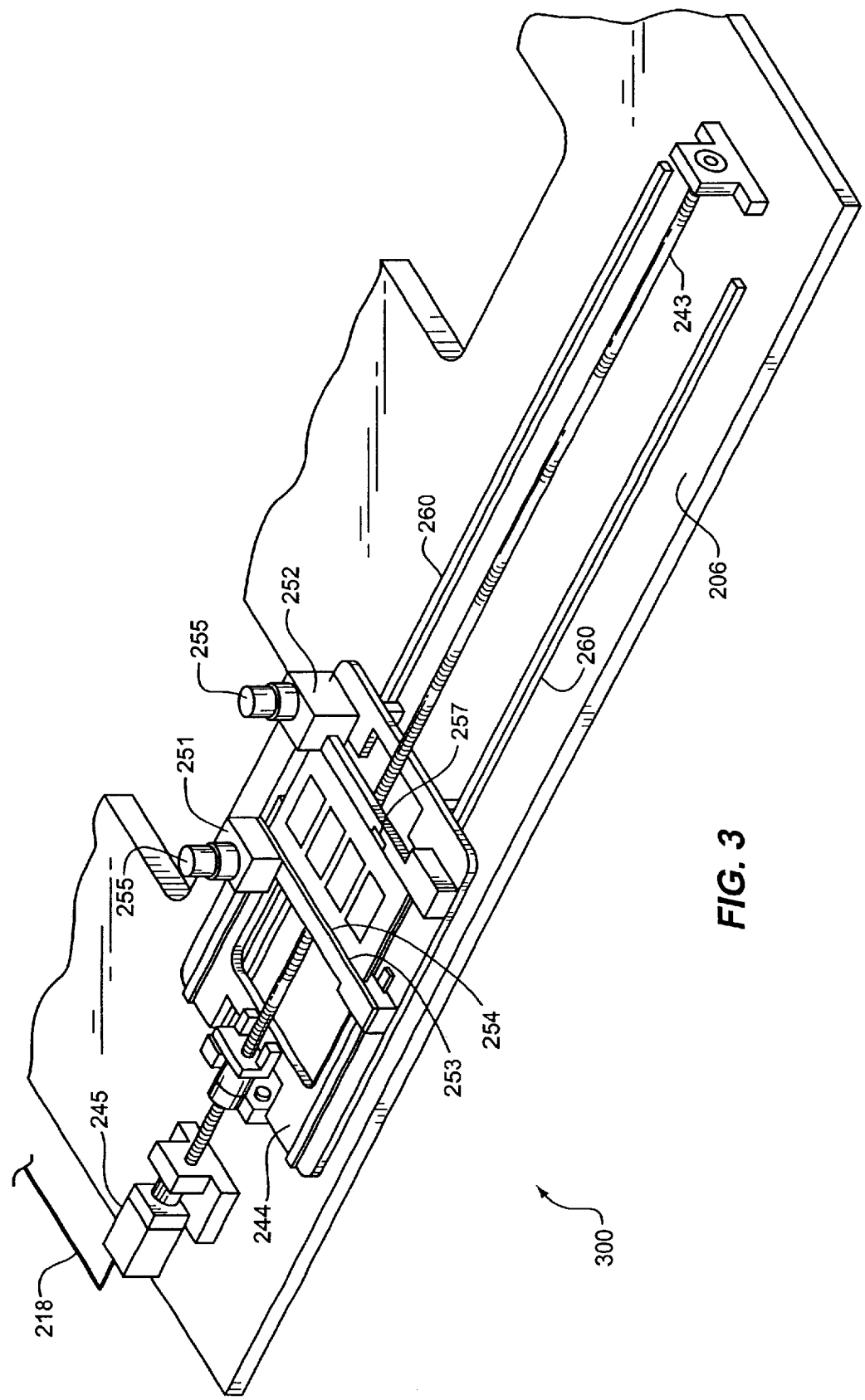
FIG. 3 illustrates a multiple router station depaneling system having a feeder station in a first position.
Figure 4:
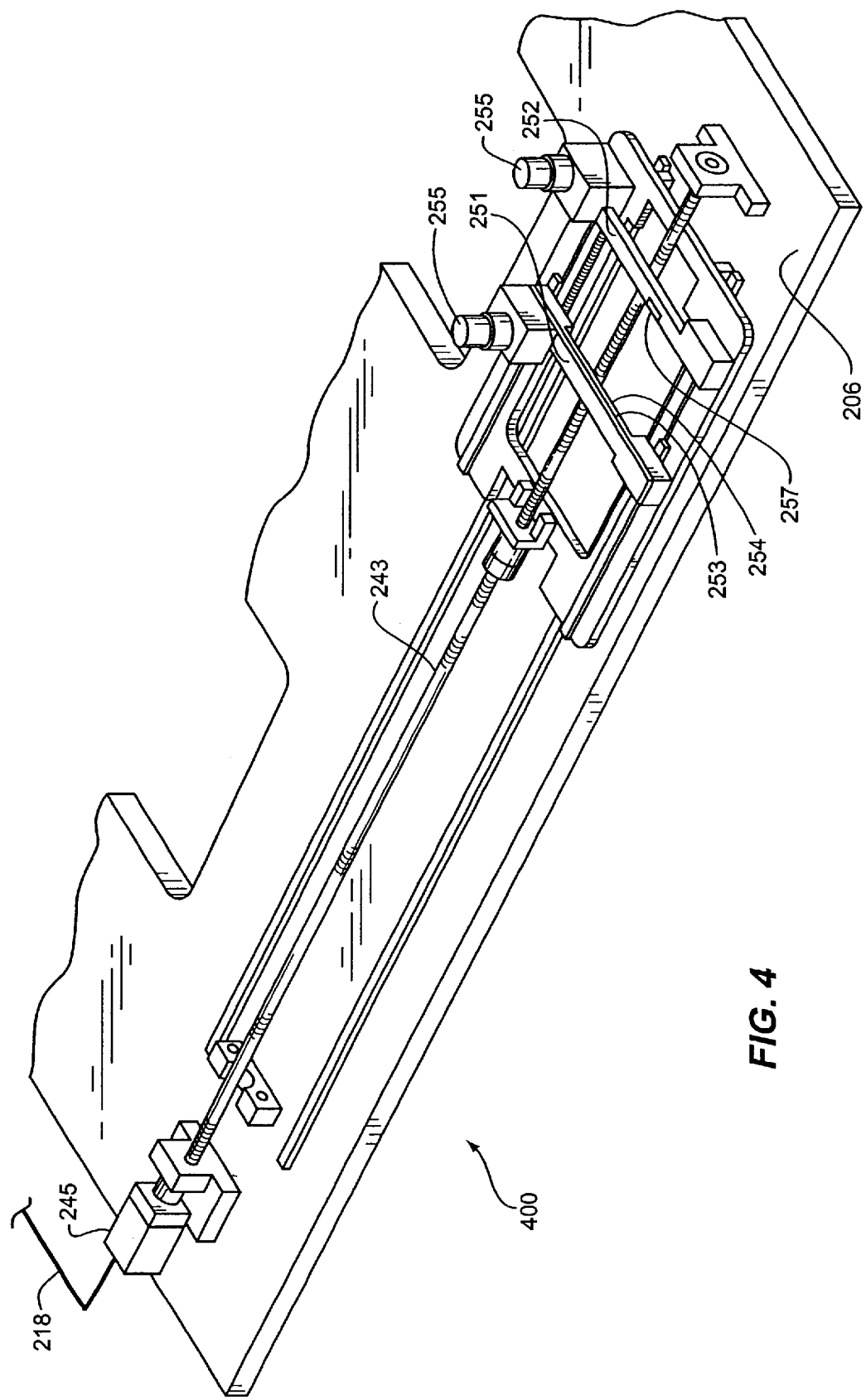
FIG. 4 illustrates a multiple router station depaneling system having a feeder station in a second position.

Feeder Station 202—FIGS. 3–4

Feeder station 202 receives a panel 100 from a feeder system (not shown) and selectively delivers panel 100 to one of router stations 203 and 203'. Those skilled in the art will notice that the motor system described for any component is interchangeable with the other motor systems to provide the movement required. Hence, it is possible to replace a lead screw with a pneumatic motor or servo motors. It is left to those skilled in the art to decide which motors to use based upon panel specific requirements and expense of parts. Furthermore, one skilled in the art will appreciate that any conveyance system for moving boards can be used to move panel 100 through feeder station 202.

FIGS. 3 and 4 illustrate a preferred exemplary embodiment of feeder station 202. Feeder station 202 is mounted on base 244. Base 244 is, in turn, mounted on lead screw 243 and guides 260. Motor 245 receives signals from controller 201 to turn lead screw 243 to move base 244 between a first end and a second end of lead screw 243 and guides 260 which moves feeder station 202 from a position to receive panels from a feeder system (Not shown) to position 300 (Shown in FIG. 3) for delivering a panel 100 to first router station 203 or to position 400 (Shown in FIG. 4) for delivering a panel 100 to second router station 203'.

A first support 251 is affixed to a first side of a top surface of base 244. A second support 252 is affixed to a second side of the top surface of base 244 opposing first support 251. First support 251 and second support 252 are spaced apart with enough space to allow panel 100 to be received into grooves 253 in the opposing surfaces of first support 251 and second support 252. Grooves 253 contain conveyor belts 254. Conveyor belts 254 are moved by conveyor motors 255. Conveyor motors 255 are activated by controller 201 to move conveyor belts 254 which in turn cause panel 100 to move though feeder station 202.

In the preferred embodiment, feeder station 202 receives a panel 100 in the following manner. Feeder station 202 is moved to a receiving position by lead screw 243 and motor 245. In the receiving position, feeder station 202 is aligned with an output of feeder system (Not Shown). The feeder system pushes a first end of panel 100 into grooves 253 of feeder station 202. Conveyor motors 255 are then activated by controller 201 and cause conveyors 254 to move panel 101 into feeder station 202. After feeder station 202 has received a panel, feeder station 202 selectively delivers the panel 100 to one of the multiple router stations 203–203'. A determination of which multiple stations can be made in one of the following manners: the type of panel 100 received can be determined and panel 100 can be delivered to a router station 203–203' that is configured to depanel PC boards from panel 100; controller 201 can determine which of router stations 203–203' are available to receive a panel 100; or controller 201 can simply alternate between router stations 203–203'. One skilled in the art will recognize that there are numerous more possibilities that can be used to determine the proper router station 203–203'.

In order to detect the type of panel 100 received by feeder station 202, the following methods can be used. In a first detection method, sensor 257 is mounted on second support 252. Sensor 257 may be a sensor that uses laser light to read an identification from panel 100. Sensor may also be any other type of sensing device that can detect an indica of the type of panel embedded or affixed to panel 100. One such identification can be a hole or notch in panel 100. A second possible identification is a bar code that is unique for each different type of panel 100. Sensor 257 detects the identification and generates an identification signal responsive to the identification. The signal is transmitted to controller 201 which uses the signal to determine which router station 203–203' should be used to depanel the PC boards. Controller 201 routes to first router station 203 if a first identification signal is received from sensor 257 and routes to second router station 203' if a second identification signal is received from optic sensor 257.

A second possible method for detecting the type of panel 100 is by the position from which panel 100 is received. If panel 100 is received while feeder station 202 is in a first receiving position, panel 100 is delivered to first router station 203. If panel 100 is received while feeder station 202 is in a second receiving position, panel 100 is delivered to second router station 203'. One skilled in the art will recognize that there are other possible methods for determining which router station 203–203' should receive panel 100.

Once the router station 203–203' to receive panel 100 has been determined, feeder station 202 delivers panel 100 in the following manner. Controller 201 begins the delivery process by transmitting signals to motor 245 to turn screw 243 in order to move feeder station 202 to a first position aligned with first router station 203 or to a second position aligned with a second router station 203'. Controller 201 then signals conveyor motors 255 to cause conveyor belts 254 to rotate. The rotation of conveyor belts 254 causes panel 100 to move through grooves 253 and into router station 203–203'.

Router station 203–203' is constructed in the following manner to receive panel 100 and remove PC boards 101 from panel 100. The operation of conveyor belts 254 in feeder station 202 causes panel 100 to be moved towards depaneled rails 530 and 531 in router 203–203'. At about the same time, controller 201 signals to conveyor motors 532 and 533 to cause conveyor belts 534 to move along depaneler rails 530 and 531. The motion of conveyor belts 534 moves panel 100 from feeder station 202 into contact with conveyor belts 534. Conveyor belts 534 move panel 100 from the feeder station 202 into router station 203.

Router stations 203 and 203' are configured in the following manner to receive a panel 100 and remove PC boards 101 from panel 100. In a preferred exemplary embodiment, router station 203–203' includes receiving base 501, robotic arm assembly 502, and router 503. One skilled in the art will appreciate that other configurations having components that perform the functional equivalents of receiving base 501, robotic arm assembly 502, and router 503 may be used in a depaneling system of the present invention.

Receiving base 501 receives the panel 100 and holds the panel 100 as tabs 104 of PC boards 101 are severed. Receiving base 501 has a first support 510 on a first side of receiving base 501 and a second support 511 on a second side opposing the first side. First support 510 and second support 511 are spaced apart with enough distance for the first and second side of panel 100 to fit into grooves 512 in first support 510 and second support 511. Conveyor belts 534 are conventional conveyor belts that fit around motors 532 and 533. Motors 532 and 533 are controlled by controller 201 and cause motors to rotate conveyor belts 534. A pneumatic motor (Not Shown) or other type of motor system is controlled by controller 201 to cause receiving base 501 to move along guides in the X axis to facilitate routing as described below.

Figure 5:
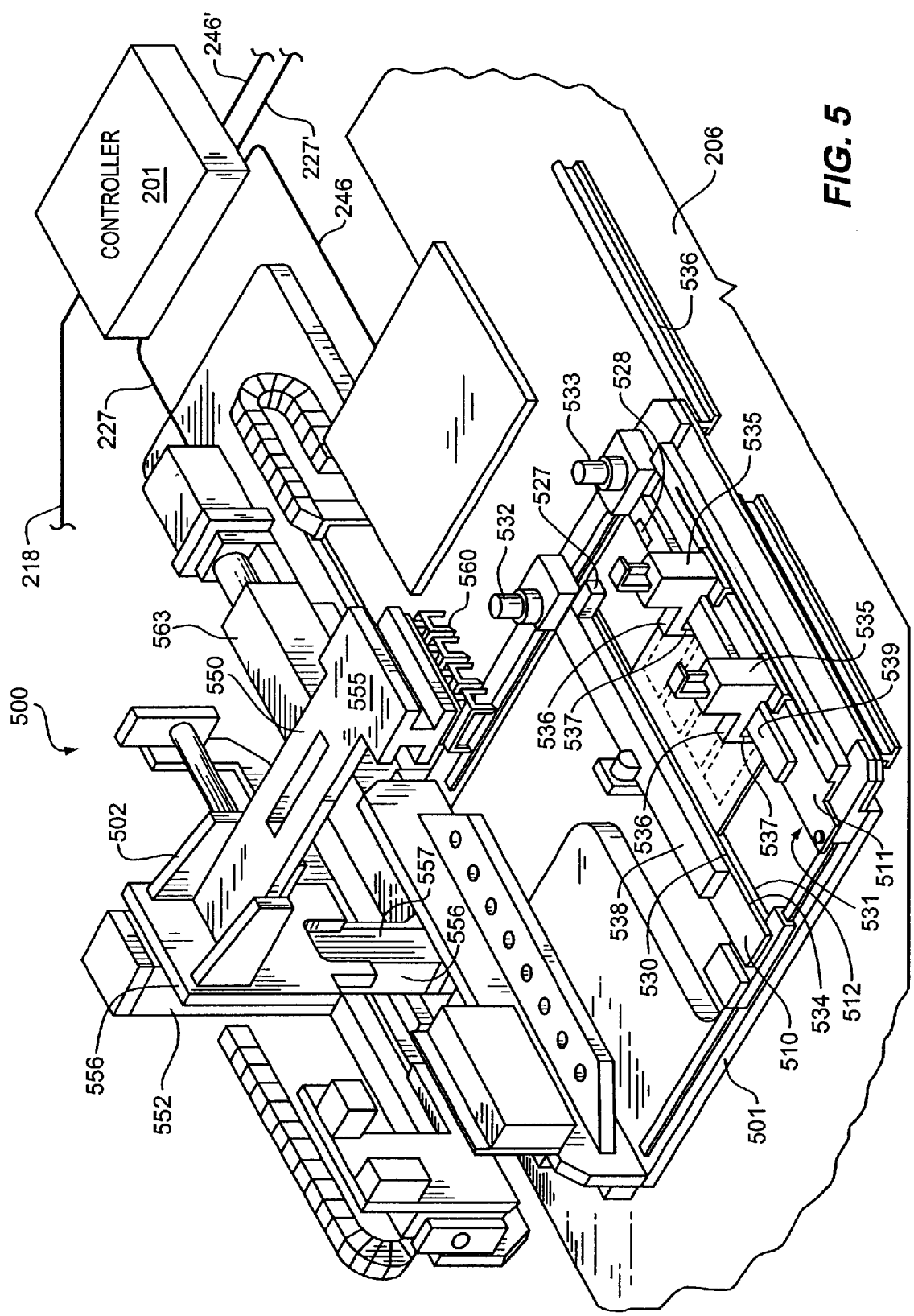
FIG. 5 illustrates a multiple router station depaneling system having a router station with a receiving table in a first position.
Figure 6:
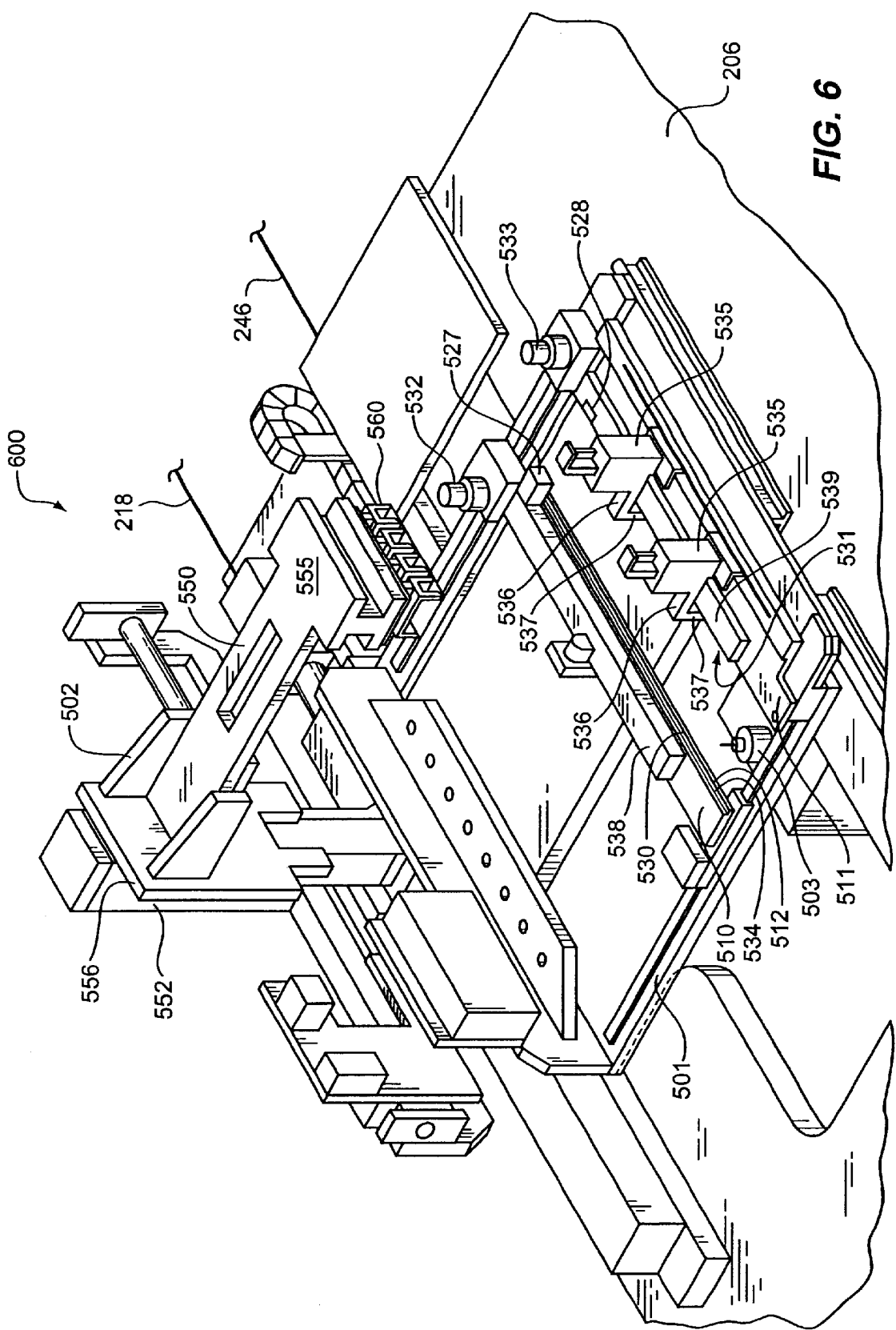
FIG. 6 illustrates a multiple router station depaneling system having a router station with a receiving table in a second position.

FIG. 5 illustrates receiving base 501 at a first position 500 proximate feeder station 202 and FIG. 6 illustrates receiving base 501 in position 600 distal from feeder station 202 along the X axis. It will be noted by those skilled in the art that pneumatic motor and guides are optional. Receiving base 501 could be stationary if the router is able to move along both the X and Y axises.

Receiving base 501 of the preferred exemplary embodiment receives a panel 100 in the following manner. The motion of conveyors 534 moves panel 100 along depaneler rails 530 and 531 until panel 100 contacts panel stop element 527. Detector 528 senses the presence of panel 100 and sends a signal to controller 201. Controller 201, responsive to a signal from detector 528, sends signals to motors 532 and 533 to stop conveyor belts 534. Panel 101 is now in the proper position to begin routing PC boards 101. Those skilled in the art will appreciate that any other system for orienting the position of panel 100 can be used in a system incorporating the present invention. When conveyor belts 534 are stopped, controller 201 communicates signals to a pair of positioning assemblies 535. Each positioning assembly 535 has a bar 536 and pin 537. Signals from controller 201 cause pneumatic cylinders (not shown) in positioning assemblies 535 to lower bars 536 down toward panel 100. Tapered pins 537 mate with holes 106 in panel 100 to hold panel 100 in a fixed position. Whereas stop element 527 positions panel 100 relatively close to the desired location with respect to the X and Y axes, pins 537 precisely position panel 100 for the routing process. With panel 100 precisely positioned by pins 537, panel 101 is clamped in place as follows for the routing process. Depaneler rails 530 and 531 are associated with rail clamps 538 and 539, respectively. Referring to depaneling rail 530, rail clamp 538 rests on top of rail 530. In response to signals from controller 201, pneumatic cylinders (not shown) between rail 530 and rail clamp 538 cause rail clamp 538 to move downward clamping panel 100 between rail clamp 538 and depaneler rail 530. Rail clamp 539 and depaneler rail 531 operate in a similar manner with respect to panel 100.

Robotic arm assembly 502 is used to hold PC boards 101 in place while all connections between PC boards 101 and panel 100 are severed. The robotic arm assembly 502 also moves PC boards 101 to registration area 204. Robotic arm assembly 502 comprises robotic arm tower 552, robotic arm support 550, and robotic arm 555. Robotic arm 555 is connected to robotic arm support 550 by bolts (not shown). Precise positioning of robotic arm 555 with respect to robotic arm support 550 is established with locating pins (not shown) on robotic arm support 550 which mate with holes (not shown) on robotic arm 555. The bolts (not shown) are provided so that a user can process panels 100 of different designs by removing robotic arm 555 and replacing it with a robotic arm 555 having a different configuration. Robotic arm support 550 is slidably connected to robotic tower 552 through guides 556. In response to signals from controller 201, pneumatic cylinder 557 moves robotic arm support 550 in the Z axis. Robotic arm support 550 moves up and down along guides 556 as pneumatic cylinder 557 operates in response to signals from controller 201. Depaneler fingers 560 are connected to robotic arm 555. A solenoid valve or other type of actuator (not shown) operates, in response to signals from controller 201 to cause each pair of fingers 560 to grasp PC board 101. Robotic tower 552 a has base which is slidably connected to guide 563. Robotic arm assembly 502 moves in the X axis, along guide 563, by the operation of a pneumatic motor.

Robotic arm 502 assembly operates in the following manner. When panel 100 is held by rail clamps 538 and 539 in depaneler rails 530 and 531, fingers 560 of arm 555 grip individual PC boards 101 in order that router assembly 503 can operate to separate PC boards 101 from panel 100. Controller 201 then signals pneumatic cylinder 557 moves robotic arm support 550 downward in the Z axis. Robotic arm support 550 moves down along guides 556 as pneumatic cylinder 557 operates in response to signals from controller 201. Robotic arm support 550 is moved downward until fingers 560 are in contact with PC boards 101 and are positioned in slots 105 of panel 100. Controller 201 then causes a solenoid to operate to cause each pair of fingers 560 to grasp PC board 101 during the process of routing PC boards 101 to sever connections between PC board 101 and panel 100.

Router—FIG. 7.

The components of router station 203 are illustrated in FIGS. 5 and 6. Router assembly 503 is mounted below table 206. Receiving base 501 and robotic arm assembly 502 are positioned on top of table 206. In the preferred embodiment, one router assembly 503 performs the severing of tabs 104 for all router stations 203–203'. In this preferred embodiment, router assembly 503 only moves along the Y-axis. This reduces the amount of components in system 200. Since router assembly 503 only moves along the Y-axis, base 502 must move along the X-axis to change the position of router assembly 503 with respect to panel 100 in order to sever all of the connections in panel 100.

Router assembly 503 is configured in the following manner in the preferred embodiment. Router head 715 is a saw, laser, torch or other cutting that can sever connections between panel 100 and PC board 101. Router assembly 503 can move in along the Y-axis to change positions and along the Z-axis to engage and disengage panel 100. A pneumatic cylinder operates in response to signals from controller 201 to move router head 715 up and down along the Z-axis. Motor 711 turns lead screw 712 in response to signals from controller 201 in order to cause router head 715 to move along the Y-axis. In order to sever connections, controller 201 first signals motor 711 to move router assembly 503 to the selected router station 203–203'. When router assembly 503 is in position under the selected router station 203–203', controller 201 activates router head 715 and signals the pneumatic cylinder upwards to begin severing connections. Router assembly 503 is then moved back and forth along the Y-axis and base 502 is moved along the X-axis to sever all of the connections.

Alternatively, router assembly 503 may move along the X axis as well. In this case, base 502 does not necessarily need to be movable along the x axis. The following components allow router assembly 503 to move along the X axis. Router head 715, motor 711 and lead screw 712 are mounted on frame 716. Motor 711 is connected to a lead screw (not shown) to move frame 716 and router head 715 along a y-axis in response to signals from controller 201. After panel 100 is positioned as described above router assembly 503 severs all connections.

After all of the tabs 104 have been cut, controller 201 signals pneumatic cylinder 557 to move robotic arm support 550 up the guides 556. This moves fingers 560 holding PC boards 101 to move upward. Controller 201 transmits a signal to clamps 538 and 539 to open and allow frame 103 to fall through an opening. As clamps 538 and 539 are being opened, robotic arm assembly 502 is moved to a position over registration station 204. Robotic arm assembly 502 is moved by controller 201 signaling a pneumatic motor to move assembly 502 to registration station 204–204'.

Registration station 204—FIG. 8.

FIG. 8 illustrates registration station 204 which provides PC boards 101 to a subsequent processing system in the following manner. Registration station 204 is comprised of a base 800 having receiving nest 801. Each receiving nest 801 is a recessed opening in base 800 that is configured to allow a PC board 101 to be fitted into the slot. Each nest 801 also holds the PC boards 101 in a known orientation. The known orientation allows the subsequent processing station to retrieve the PC boards 101 in a known position. Base 800 is also connected to guide 804. A pneumatic motor (not shown) or other motor system moves base 800 along guide 804 in the X-axis between a receiving position and a delivery position.

Registration station 204 receives and delivers PC boards 101 in the follow manner. After the PC boards 101 are severed from the panel 100. Controller 201 signals a pneumatic cylinder 557 to move robotic arm support 550 up guides 556. At approximately the same time, controller 201 signal a pneumatic motor to move registration station 204–204' into a receiving position proximate router station 203–203'. Robotic assembly 502 is then moved along guide 564 to a position where PC boards 101 being held by fingers 560 are directly over receiving slots 801. Robotic arm support 550 is then lowered along guides 557. A pneumatic motor is then signaled and PC boards 101 are released and placed inside receiving slots 801. After PC boards 101 are placed in receiving nests 801, robotic assembly 502 is returned to a position in which fingers 560 are over base 501 and ready to grasp a subsequent panel 100. Controller 201 also signals the pneumatic motors to move registration station 204 to a delivery position distal router station 203–203'. A subsequent processing station then retrieves PC boards 101 from receiving slots 801 for further processing.

SUMMARY

The above disclosed invention provides a depaneling station having multiple router stations. The multiple router stations increase the cycle needed to depanel PC boards from a panel. A preferred exemplary of this invention has a common router for each router station that reduces the number of components needed in the depaneling system. To facilitate the common router, the router stations have a receiving base that moves along a first axis. The movable receiving base allows the router to be designed to only move along one axis. It is envisioned that one skilled in the art can and will design a depaneling system which has multiple router stations that infringes the present invention as set forth in the claims below either literally or through the Doctrine of Equivalents.

What is claimed is:

1. A depaneling system for severing connections between PC boards and panels containing said PC boards, said depaneling system comprising:
    a first router station configured to receive and transfer one of a plurality of panels along a first plane and sever connections between at least one PC board and said one of said plurality of panels,
    a second router station configured to receive and transfer another one of said plurality of panels along a second plane that is substantially parallel to said first plane and sever connections between at least one PC board and said another one of said plurality of panels; and
    a feeding station having a base, said feeding station configured to:
        receive said panels onto said base,
        move said base substantially along a third plane that runs proximate said first router station and said second router station, and
        selectively deliver said panels to said first router station or said second router station responsive to an instruction signal.

2. The depaneling system of claim 1 wherein said feeding station is further configured to selectively deliver said panels to said first router station or said second router station depending upon a determination of which of said first router station and said second router station is available to receive said panels.

3. The depaneling system of claim 1 wherein said feeding station is further configured to selectively deliver said panels to said first router station based upon a determination that said panels are a first type of panel and to selectively deliver said panels to said second router station based upon a determination that said panels are a second type of panel.

4. The depaneling system of claim 3 wherein said feeder station comprises:
    an identification system configured to identify the type of panel received by said feeder station.

5. The depaneling system of claim 4 wherein said identification system comprises:
    a fiber optic sensor configured to read an identification code from said panels received by said feeder station, generate a first signal responsive to reading a first identification, and generate a second signal responsive to reading a second identification.

6. The depaneling system of claim 5 wherein said identification code comprises a bar code.

7. The depaneling station of claim 1 wherein said base of said feeder station comprises:
    a first support on a first side of said base of said feeder station;
    a second support on a second side of said base of said feeder station opposing said first support wherein said panels are received between said first and second support; and
    a conveyor system along said first and second supports movable to receive and deliver said panels.

8. The depaneling system of claim 1 wherein said feeder station comprises:
    a motor that moves said base of said feeder station along said third plane between a position proximate said first router station and a position proximate said second router station.

9. The depaneling system of claim 8 wherein said motor is a pneumatic motor.

10. The depaneling system of claim 8 wherein said motor comprises:
    a screw;
    a threaded mounting affixed to a bottom surface of said base of said feeder station that is mated to said screw; and
    said motor being effective to turn said screw in a first and a second direction to move said base of said feeder station along said third plane.

11. The depaneling system of claim 1 wherein said first and second router station each comprise:
    a receiving table configured to receive said panels from said feeding station;
    a router configured to sever said connections between said at least one PC board and said panels; and
    a gripping device configured to hold said at least one PC board in place as said router severs said connections.

12. The depaneling station of claim 11 wherein:
    said receiving table in said first routing station includes a motor configured to move said receiving table in said first routing station along said first plane to use said router in said first routing station to sever said connections; and
    said receiving table in said second routing station includes a motor configured to move said receiving table in said second routing station along said second plane to use said router in said second routing station to sever said connections.

13. The depaneling system of claim 11 wherein said gripping device comprises:
    a robotic arm assembly;
    a robotic arm attached to said robotic arm assembly; and
    a robotic hand at an end of said robotic arm that is configured to grip said at least one PC board in said panels while said router severs said connections.

14. The depaneling system of claim 13 further comprising:
    a motor configured to move said robotic arm from a first position in which said robotic hand grips said at least one PC board in said receiving table to a second position in which said robotic hand is removed from said receiving table.

15. The depaneling system of claim 13 further comprising:
    a motor configured to move said robotic arm assembly from a first position proximate said receiving table to a second position proximate a registration station.

16. The depaneling system of claim 11 wherein said receiving table comprises:
    a first rail assembly on a first side of said receiving table;
    a second rail assembly on a second side of said receiving table opposing said first rail assembly;
    a groove along each of said first and said second rail assemblies for receiving first and second sides of said panels.

17. The depaneling system of claim 16 further comprising:
   registration pins inside said grooves mated to fit through an opening in said panels to hold said panels in a known position.

18. The depaneling system of claim 16 further comprising:
   an optic sensor for detecting a registration pin hole in said panels.

19. The depaneling system of claim 1 further comprising:
   a first registration station configured to receive said at least one PC board from said first router station wherein all of said connections between said at least one PC board and said one of said plurality of panels has been severed.

20. The depaneling system of claim 19 wherein said first registration station comprises:
   a base; and
   at least one nest on said base of said first registration station that is configured to house a PC board.

21. The depaneling system of claim 20 further comprising:
   a motor configured to move said base of said first registration station from a first position proximate said first router station to receive said at least one PC board to a second position proximate a subsequent processing system to deliver said at least one PC board to said subsequent processing system.

22. The depaneling system of claim 1 further comprising:
   a second registration station configured to receive said at least one PC board from said second router station wherein all of said connections between said at least one PC board and said another one of said plurality of panels has been severed.

23. The depaneling system of claim 22 wherein said second registration station comprises:
   a base; and
   at least one nest on said base of said second registration station that is configured to house a PC board.

24. The depaneling system of claim 23 wherein said second registration station further comprises:
   a motor configured to move said base of said second registration station from a first position proximate said second router station to receive said at least one PC board to a second position proximate a subsequent processing system to deliver said at least one PC board to said subsequent processing system.

25. The depaneling system of claim 11 wherein said router in said first router station is different than said router in said second router station.

26. The depaneling system of claim 1 wherein:
   said first router station receives a first routing signal and severs said connections responsive to said first routing signal;
   said second router station receives a second routing signal and severs said connections responsive to said second routing signal;
   said first router station and said second router station configured to operate independently based on said first routing signal and said second routing signal.

* * * * *